United States Patent
Halama et al.

(10) Patent No.: US 7,424,393 B2
(45) Date of Patent: Sep. 9, 2008

(54) WAFER INSPECTION DEVICE

(75) Inventors: Michael Halama, Wetzlar (DE); Albert Kreh, Solms (DE); Guenter Schmidt, Leun (DE)

(73) Assignee: Vistec Semiconductor Systems GmbH, Wetzlar (DE)

( * ) Notice: Subject to any disclaimer, the term of this patent is extended or adjusted under 35 U.S.C. 154(b) by 54 days.

(21) Appl. No.: 10/563,499

(22) PCT Filed: May 12, 2004

(86) PCT No.: PCT/EP2004/050765

§ 371 (c)(1),
(2), (4) Date: Aug. 24, 2006

(87) PCT Pub. No.: WO2005/004208

PCT Pub. Date: Jan. 13, 2005

(65) Prior Publication Data

US 2007/0040241 A1 Feb. 22, 2007

(30) Foreign Application Priority Data

Jul. 5, 2003 (DE) ................................. 103 30 506

(51) Int. Cl.
*G21C 17/00* (2006.01)
*G01R 31/26* (2006.01)

(52) U.S. Cl. ...................................... 702/182; 324/719
(58) Field of Classification Search ................. 702/182, 702/47, 81, 84; 355/53, 67, 77
See application file for complete search history.

(56) References Cited

U.S. PATENT DOCUMENTS

| | | | |
|---|---|---|---|
| 3,967,132 A | 6/1976 | Takamine | |
| 5,421,894 A | 6/1995 | Lei et al. | |
| 6,510,755 B1 | 1/2003 | Higuchi et al. | |
| 6,732,610 B2 | 5/2004 | Higuchi et al. | |
| 6,864,602 B2 | 3/2005 | Korenaga | |
| 7,241,993 B2 * | 7/2007 | Nakasuji et al. | 250/310 |
| 2001/0030739 A1 * | 10/2001 | Hase et al. | 355/53 |

FOREIGN PATENT DOCUMENTS

JP 01 230986 9/1989

* cited by examiner

*Primary Examiner*—Bryan Bui
(74) *Attorney, Agent, or Firm*—Simpson & Simpson, PLLC

(57) ABSTRACT

A semiconductor substrate or wafer inspection device for detecting defects on wafer surfaces includes an air-cushion stage which can be displaced in two directions (X,Y) that are perpendicular to one another. Several air nozzles are provided for this purpose. At least one valve is connected to at least one electric control unit, the valve being configured in such a way that a normal pressure prevails in the air nozzles when the electric control unit delivers a corresponding signal.

13 Claims, 4 Drawing Sheets

WAFER INSPECTION DEVICE

CROSS REFERENCE TO RELATED APPLICATION

This application claims the benefit of International Application PCT/EP2004/050765, filed May 12, 2004, which claims priority from German Application 103 30 506.8, filed Jul. 5, 2003.

BACKGROUND OF THE INVENTION

The invention relates to a device for inspection of wafers for semiconductors. In particular, the invention relates to a device for detecting defects on the wafer surface, said device being disposed on a stage which can be displaced in two mutually perpendicular directions.

During the fabrication process in semiconductor production, wafers are sequentially treated in a multitude of process steps. With increasing integration density, the requirements on the quality of the structures formed on the wafers increase. To be able to check the quality of the structures formed and detect possibly present defects, corresponding requirement exists in terms of the quality, accuracy and reproducibility of the equipment components that handle the wafers. This means that in the position determination and reacquisition of the position after a special event, for example after a power outage, failure of the control software and/or emergency shut-down of the entire system, the stage that displaces the wafer in the two mutually perpendicular directions allows rapid and reliable readjustment.

SUMMARY OF THE INVENTION

The object of the invention is to provide a device for wafer inspection with which the position of the stage can be securely fixed in the event of a special event.

This objective is reached by means of a device comprising a stage that is displaceable in two directions (X,Y) which are perpendicular to one another and onto which is placed the wafer to be inspected. The stage is air-cushioned and provided with several air nozzles, characterized in that there is provided at least one valve connected with at least one electric control unit. The valve is configured so that normal pressure prevails in the air nozzles when the electric control unit delivers a corresponding signal.

It is particularly advantageous if in the case of the occurrence a special event, for example a power outage, software failure or emergency shut-down of the entire system, the stage that is displaceable in two mutually perpendicular special directions is fixed in the position it occupies at that very instant.

The displaceable stage carrying a wafer that is to be inspected is air-cushioned by several air nozzles. There is provided at least one valve connected with at least one electric control unit. The valve is configured in a manner such that normal pressure prevails in the air nozzles when the electric control unit delivers a corresponding signal or indicates an event.

For the displacement of the stage in the two perpendicularly disposed directions, there is provided a first and a second electric drive. Both the first and the second drive are linear motors.

The stage consists of a first and a second stage element. Parallel to the first linear motor is disposed at least a first track that cooperates with a multitude of air nozzles while compressed air emerges from the air nozzles thus forming an air bearing for the X direction. Similarly, at least one second track is disposed parallel to the second linear motor which track cooperates with a multitude of air nozzles while compressed air emerges from the air nozzle thus forming an air bearing for the Y direction. When the valve is open, normal pressure prevails in the air nozzles so that the stage (or the first and second stage element) with the air nozzles rests on the first and the second track and is thus fixed in the position the stage had occupied during the generation of the signal. The valve can be disposed on the air nozzle itself or in the air line itself.

BRIEF DESCRIPTION OF THE DRAWINGS

The drawings represent schematically the object of the invention which in the following will be described by reference to the figures of which.

DESCRIPTION OF THE PREFERRED EMBODIMENTS

Figure 1:
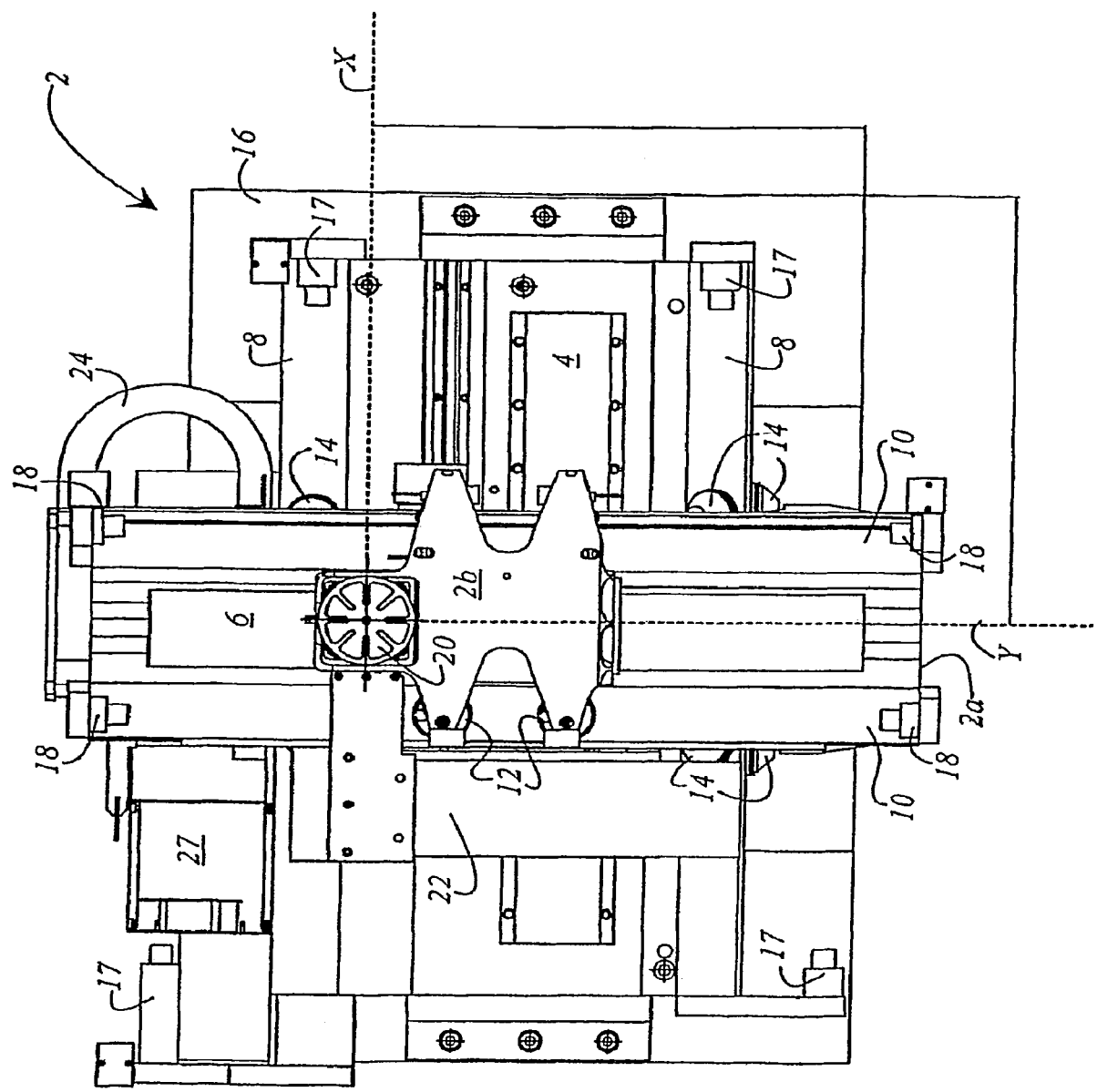
FIG. 1 is a top view of the stage of the invention.

FIG. 1 shows a top view of the stage 2 that is displaceable in a first direction X and a second direction Y. The first and the second direction X and Y are disposed perpendicular to one another. To move stage 2 along the first direction X, there is provided a first electric drive 4. To move stage 2 along the second direction Y, there is provided a second electric drive 6. The first and the second electric drive 4 and 6 are configured as linear motors. Stage 2 consists of a first stage element 2a and a second stage element 2b. First stage element 2a is guided on at least one track 8 which is parallel to the first direction X. Similarly, second stage element 2b is guided on at least one other track 10 which is parallel to the second direction Y.

The second stage element 2b comprises several air nozzles 12 which cooperate with the at least second track 10. The first stage element 2a also has several air nozzles 14 which cooperate with the at least first track 8. Through air nozzles 12 and 14, the gas is blown out at a pressure that is higher than the prevailing normal pressure. In this manner, air nozzles 12 form an air cushion between air nozzles 12 and the second track 10, an air cushion which allows the second stage element 2b to glide on the track in nearly frictionless manner. Similarly, air nozzles 14 form between air nozzles 14 and the first track 8 an air cushion which allows the first stage element 2a to glide on the track in nearly frictionless manner. The at least one first track 8 and the first electric drive 4 are mounted on a massive block 16. In addition, on the massive block 16 there are also provided several stops 17 which limit the movement of the first stage element 2a on both sides in the X direction. On the second stage element 2b, there are also provided several stops 18 which limit the movement of second stage element 2b on both sides in the Y direction. Second stage element 2b bears a receptacle 20 for a wafer 25 (see FIG. 2). In a flexible strap 22, several supply lines (not shown) are led to second stage element 2b. In another flexible strap 24, several supply lines (not shown) are also led to first stage element 2a. The supply lines to the first or second stage element 2a or 2b are compressed air lines or electric lines. Flexible straps 22 and 24 thus make it possible for the supply lines safely to follow the movements of the first and the second stage element 2a and 2b.

Figure 2:
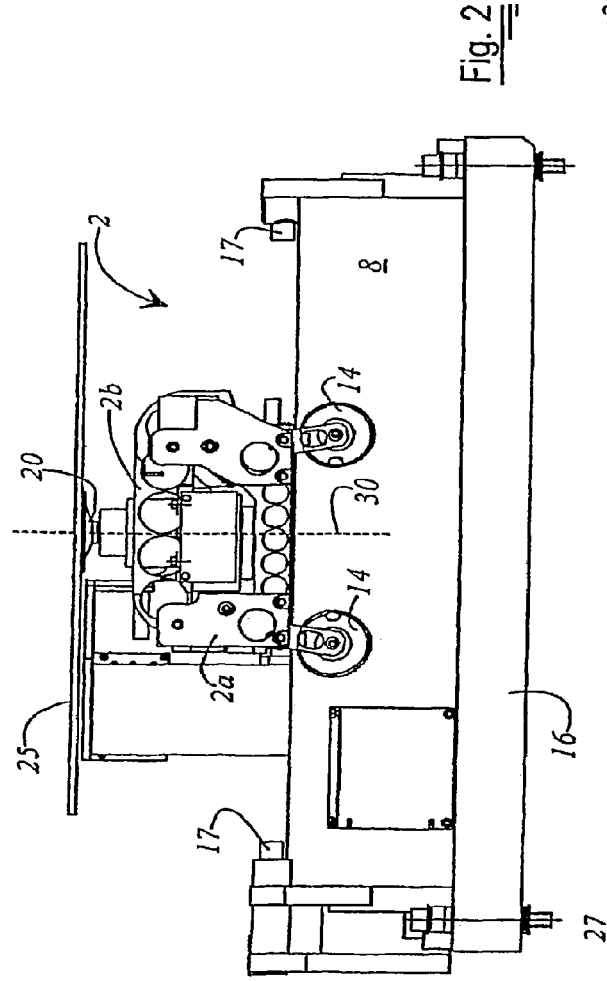
FIG. 2 is a side view of the stage parallel to the X direction.

FIG. 2 shows a side view of stage 2 parallel to the X direction in FIG. 1. A wafer 25 is placed on receptacle 20, the receptacle being rotatable about a rotational axis 30. First stage element 2a cooperates with several air nozzles 14 and the at least first track 8. Through air nozzles 14 gas is blown at a pressure that is higher than the prevailing normal pressure. In this manner, an air cushion is formed between air nozzles 14 and first track 8 which air cushion allows first stage element 2a to glide along first track 8 in nearly frictionless manner. The movement of first stage element 2a is limited on both sides by stops 17.

Figure 3:
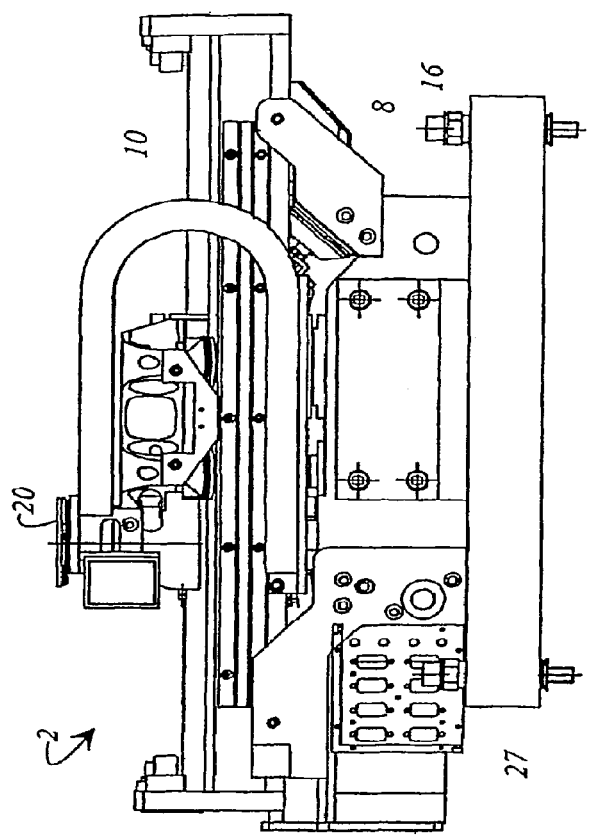
FIG. 3 is a side view of the stage parallel to the Y-direction.

FIG. 3 shows a side view of stage 2 parallel to the Y direction in FIG. 1. Second stage element 2b is displaceable along second track 10. Second track 10 cooperates with the several air nozzles 12 that are provided on second stage element 2b. By means of the gas emerging under pressure, air nozzles 12 generate an air cushion on which second stage element 2b glides along second track 10. The movement of second stage element 2b is limited on both sides by stops 18. Moreover, stage 2 comprises a control unit 27 whereby the electric elements or the air supply to air nozzles 12 and 14 are regulated and controlled. As shown, for example, in FIG. 3, a flexible strap 22 is led to second stage element 2b. In or on the flexible strap there are provided corresponding electric lines or air supply lines extending from control unit 27 to second stage element 2b or to the air nozzles 12 thereof.

Figure 4A:
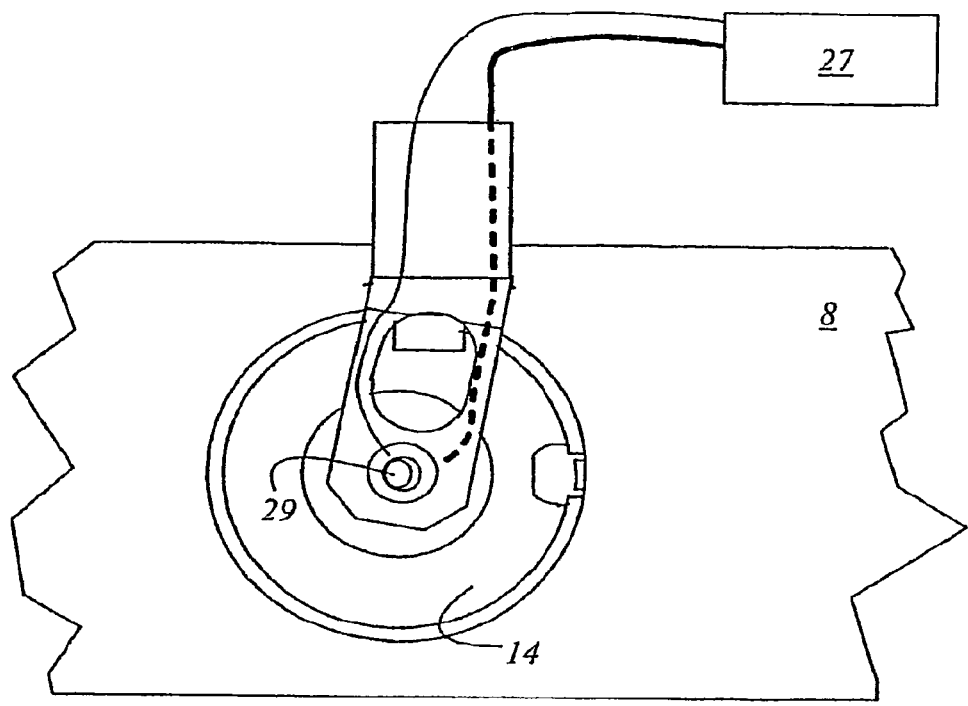
FIG. 4a is a detailed view of a first embodiment of the connection of the air nozzles and with the control unit.
Figure 4B:
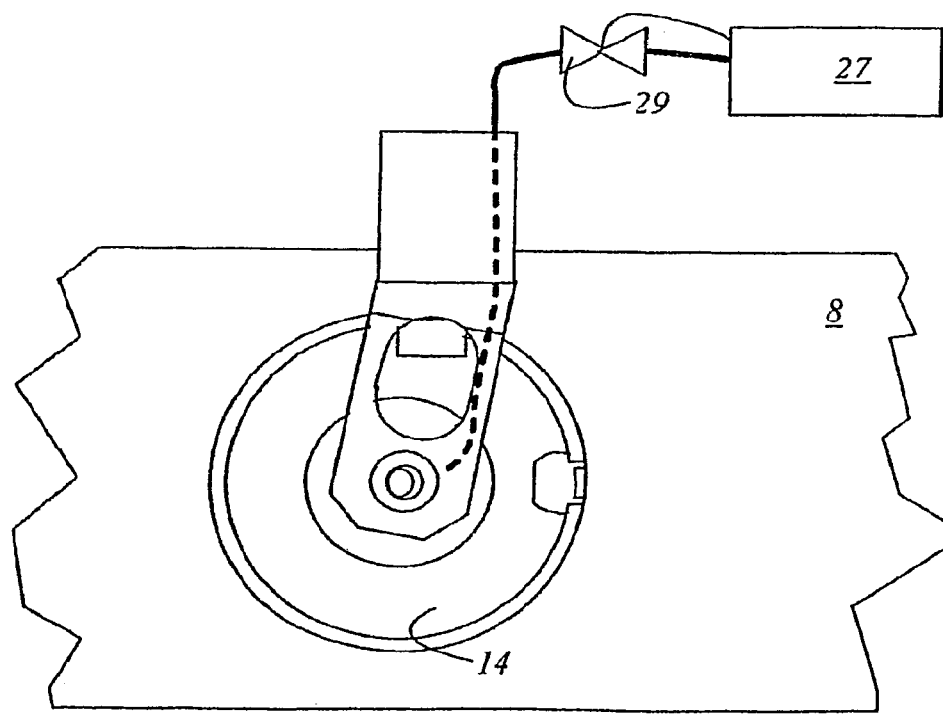
FIG. 4b is a detailed view of a second embodiment of the connection of the air nozzles with the control unit.

FIGS. 4a and 4b show a schematic representation of a valve 29 that cooperates with one of air nozzles 12 or 14. Valve 29 is connected with control unit 27 and is configured in a manner such that it provides normal pressure in air bearings 12 and 14 when electric control unit 27 delivers a corresponding signal. Control unit 27 generates a signal when, for example, the software fails, the power supply to the system fails and/or an emergency shut-down of the entire system is initialized. FIGS. 4a and 4b each show an air nozzle 12 or 14 that cooperates with track 8. To those skilled in the art it will be evident that an air nozzle was selected for the representation of the invention and that for all other nozzles a corresponding action relationship applies.

FIG. 4a shows a first embodiment of the invention. Here valve 29 is disposed directly on air nozzle 14. Air nozzle 14 is connected to control unit 27 by at least one air line 32. Through air line 32, air nozzle 14 is supplied with compressed air. Valve 29 is connected with control unit 27 also by an electric line 34. The electric line delivers to valve 29 a signal causing valve 29 to open and providing normal pressure in the air bearings. By establishing normal pressure, air no longer exits from the nozzles and both the first and the second stage element 2a and 2b are made to rest on tracks 8 and 10.

FIG. 4b shows the embodiment according to which control unit 27 inserts valve 29 in air line 32 into air nozzle 14. As shown in FIGS. 1 and 2, first and second stage element 2a and 2b are connected with flexible straps 22 and 24 which lead the at least one electric line 34 and the at least one air line 34 from the control unit to air nozzles 12 and 14 of the air bearings or to the first and second stage element 2a and 2b. Flexible straps 22 and 24 exert on the first and the second stage element 2a and 2b a force that can readily be overcome by the energized linear motors. If, for example, there is a power outage in the linear motors, the mechanical force of the flexible straps 22 and 24 would suffice to move the first and/or second stage element 2a and 2b. When inspecting wafers or semiconductor substrates, it is particularly important that the position of stage 2 or of the first and second stage element 2a and 2b be known at all times. If in the event of a power outage or emergency shut-down stage 2 were to move without a record of the position data, then when the system is restarted the wafer could be damaged because the wafer must be transported back in cassettes (not shown) allocated to the system.

Figure 5:
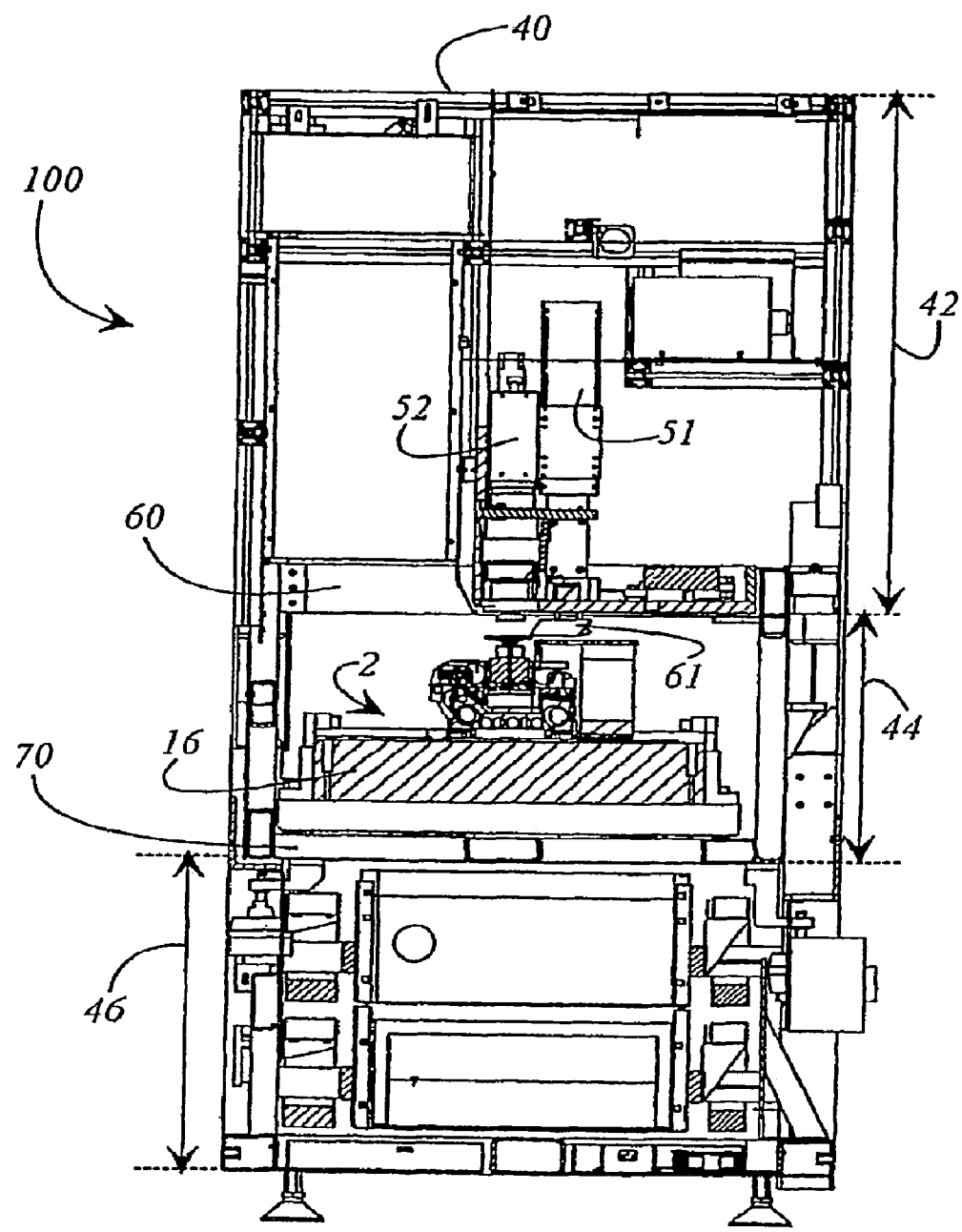
FIG. 5 is a representation of the arrangement of the stage in the entire system for wafer inspection.

FIG. 5 shows a representation of the arrangement of stage 2 in the overall system 100 for wafer inspection. System 100 is surrounded by a housing 40 and is divided into a first section 42, a second section 44 and a third section 46. Housing 40 is closed by walls (not shown) on all outer surfaces so that inside housing 40 certain clean room conditions prevail. In first section 42 of housing 40 there are disposed in essence several illumination devices 51 and at least one detection device 52. First section 42 is separated from second section 44 by a mounting plate 60. The light from the illumination device 51 is guided via optical means 61 through the mounting plate 60 all the way to the surface of the wafer to be inspected. In the second space is located stage 2, which as already indicated in the description of FIG. 1, is displaceable in the X and Y directions. Stage 2 is mounted on a separating plate 70 which separates the second and the third section 44 and 46 from one another. Third section 46 surrounds several control units 27 or computers responsible for the guidance, control and regulation of system 100 and of the individual components of the system. In addition, these devices can also acquire and evaluate data.

We claim:

1. A device for wafer inspection, which comprises a stage for mounting a wafer thereon for inspection, said stage being displaceable in two directions (X,Y) perpendicular to one another, said stage being air-cushioned and provided with a plurality of air nozzles, at least one valve, at least one electric control unit, said at least one valve connected to said at least one electric control unit, wherein said at least one valve is configured so that normal pressure prevails in said air nozzles when said electric control unit delivers a corresponding signal.

2. The device as defined in claim 1, wherein the signal is triggered by a power outage.

3. The device as defined in claim 1, wherein the signal is triggered by an emergency shut-down.

4. The device as defined in claim 1, wherein the signal is triggered by a software failure.

5. The device as defined in claim 1, comprising a first and a second electric drive means for moving said stage along the two displaceable directions (X, Y).

6. The device as defined in claim 1, wherein said stage comprises a receptacle for inspection of the wafer.

7. The device as defined in claim 1, wherein the at least one valve is provided on the air nozzle.

8. The device as defined in claim 1, wherein the at least one valve is disposed in at least one air supply line.

9. A device for wafer inspection, which comprises a stage for mounting a wafer thereon for inspection, said stage being displaceable in two directions (X,Y) perpendicular to one another by first and second electric drive means comprising at least first and second linear motors, said stage being air-cushioned and provided with a plurality of air nozzles, at least one valve, at least one electric control unit, said at least one valve connected to said at least one electric control unit, wherein said at least one valve is configured so that normal pressure prevails in said air nozzles when said electric control unit delivers a corresponding signal.

10. The device as defined in claim 9, wherein parallel to the first linear motor there is disposed at least one first track which cooperates with said plurality of air nozzles, and compressed air emerging through said air nozzles forming an air bearing for the (X) direction.

11. The device as defined in claim 10, wherein parallel to the second linear motor there is disposed at least one second track which cooperates with said plurality of air nozzles, the compressed air emerging through said air nozzles forming an air bearing for the (Y) direction.

12. The device as defined in claim 11, configured so that when said at least one valve is open, normal pressure prevails in the air nozzles so that the stage with said plurality of air nozzles rests on the first and second tracks, wherein the position of said stage occupied during the generation of the signal thus being determined.

13. The device as defined in claim 9, wherein said stage comprises housing means for said at least the first and second linear motors, corresponding air nozzles for a first and a second stage element, at least one control unit, air supply lines and electric lines.

* * * * *